US012796457B2

(12) United States Patent
Schuette et al.

(10) Patent No.: US 12,796,457 B2
(45) Date of Patent: Nov. 10, 2026

(54) TOPSIDE COOLING FOR SEMICONDUCTOR DEVICE

(71) Applicant: Wolfspeed, Inc., Durham, NC (US)

(72) Inventors: Michael Lee Schuette, Sunbury, OH (US); KyoungKeun Joseph Lee, Cary, NC (US); Matthew R. King, Wake Forest, NC (US); Christer Hallin, Hillsborough, NC (US); Fabian Radulescu, Chapel Hill, NC (US); Thomas Albert Kuhr, Durham, NC (US); Scott Sheppard, Chapel Hill, NC (US); James Scott Tweedie, Raleigh, NC (US); Kyle Bothe, Cary, NC (US)

(*) Notice: Subject to any disclaimer, the term of this patent is extended or adjusted under 35 U.S.C. 154(b) by 508 days.

(21) Appl. No.: 18/340,503

(22) Filed: Jun. 23, 2023

(65) Prior Publication Data

US 2024/0429120 A1 Dec. 26, 2024

(51) Int. Cl.

| | |
|---|---|
| ***H10W 40/00*** | (2026.01) |
| ***H10D 30/01*** | (2025.01) |
| ***H10D 30/47*** | (2025.01) |
| ***H10D 62/85*** | (2025.01) |
| ***H10D 64/00*** | (2025.01) |

(Continued)

(52) U.S. Cl.

CPC .......... *H10W 40/22* (2026.01); *H10D 30/015* (2025.01); *H10D 30/475* (2025.01); *H10D 62/8503* (2025.01); *H10D 64/111* (2025.01); *H10W 20/20* (2026.01);

(Continued)

(58) Field of Classification Search

CPC ............... H01L 23/373; H01L 23/3731; H01L 23/3732; H01L 23/367; H10D 30/015; H10D 64/111; H10W 40/22; H10W 40/254; H10W 40/259; H10W 40/228

See application file for complete search history.

(56) References Cited

U.S. PATENT DOCUMENTS 4,946,547 A 8/1990 Palmour et al.
5,192,987 A 3/1993 Khan et al.

(Continued)

OTHER PUBLICATIONS

Graebner, J.E. (1995). Thermal Conductivity of Diamond. In: Pan, L.S., Kania, D.R. (eds) Diamond: Electronic Properties and Applications. The Kluwer International Series in Engineering and Computer Science. Springer, Boston, MA. https://doi.org/10.1007/978-1-4615-2257-7_7 (Year: 1995).*

(Continued)

*Primary Examiner* — Reema Patel

(74) *Attorney, Agent, or Firm* — Dority & Manning, P.A.

(57) ABSTRACT

Semiconductor devices are provided. In one example, a semiconductor device includes a Group III-nitride semiconductor structure. The semiconductor device may include a gate contact on the Group III-nitride semiconductor structure. The semiconductor device may include a field plate overlapping the Group III-nitride semiconductor structure. The semiconductor device may include a thermally conductive passivation layer overlapping the gate contact. The thermally conductive passivation layer may be between the field plate and the Group III-nitride semiconductor structure. The thermally conductive passivation layer may contact the Group III-nitride semiconductor structure. The thermally conductive passivation layer may have a thermal conductivity of at least about 80 W/(m·k).

20 Claims, 12 Drawing Sheets

(51) Int. Cl.
*H10W 20/20* (2026.01)
*H10W 40/22* (2026.01)
*H10W 40/25* (2026.01)
*H10W 74/10* (2026.01)
*H10W 99/00* (2026.01)

(52) U.S. Cl.
CPC ....... *H10W 40/254* (2026.01); *H10W 40/259* (2026.01); *H10W 74/137* (2026.01); *H10W 99/00* (2026.01)

(56) References Cited

U.S. PATENT DOCUMENTS

| | | | |
|---|---|---|---|
| 5,200,022 | A | 4/1993 | Kong et al. |
| 5,210,051 | A | 5/1993 | Carter, Jr. |
| 5,296,395 | A | 3/1994 | Khan et al. |
| RE34,861 | E | 2/1995 | Davis et al. |
| 5,393,993 | A | 2/1995 | Edmond et al. |
| 5,523,589 | A | 6/1996 | Edmond et al. |
| 6,218,680 | B1 | 4/2001 | Carter, Jr. et al. |
| 6,316,793 | B1 | 11/2001 | Sheppard et al. |
| 6,548,333 | B2 | 4/2003 | Smith |
| 6,586,781 | B2 | 7/2003 | Wu et al. |
| 7,030,428 | B2 | 4/2006 | Saxler |
| 7,045,404 | B2 | 5/2006 | Sheppard et al. |
| 7,230,284 | B2 | 6/2007 | Parikh et al. |
| 7,332,795 | B2 | 2/2008 | Smith et al. |
| 7,544,963 | B2 | 6/2009 | Saxler |
| 7,548,112 | B2 | 6/2009 | Sheppard |
| 7,592,211 | B2 | 9/2009 | Sheppard et al. |
| 7,615,774 | B2 | 11/2009 | Saxler |
| 7,709,269 | B2 | 5/2010 | Smith et al. |
| 7,709,859 | B2 | 5/2010 | Smith et al. |
| 8,049,252 | B2 | 11/2011 | Smith et al. |
| 8,120,064 | B2 | 2/2012 | Parikh et al. |
| 8,563,372 | B2 | 10/2013 | Hagleitner et al. |
| 9,214,352 | B2 | 12/2015 | Hagleitner et al. |
| 10,971,612 | B2 | 4/2021 | Bothe et al. |
| 2016/0118460 | A1* | 4/2016 | Pei ..................... H10D 30/6738 257/9 |
| 2017/0358670 | A1* | 12/2017 | Kub ..................... H10D 64/111 |
| 2020/0343156 | A1* | 10/2020 | Okamoto ................ H01L 23/36 |
| 2022/0130965 | A1 | 4/2022 | Bothe et al. |

OTHER PUBLICATIONS

Kardys, Gary. (2018). What is the Ultimate Dielectric Material? Diamond Materials, Part 4. https://insights.globalspec.com/article/9768/what-is-the-ultimate-dielectric-material-diamond-materials-part-4#:~:text=Dielectric%20Diamond%20Coatings,microcracks%20from%20thermal%20expansion%20mis (Year: 2018).*

"Optional." Merriam-Webster.com. 2026. https://www.merriam-webster.com/dictionary/optional (Mar. 10, 2026). (Year: 2026).*

* cited by examiner

TOPSIDE COOLING FOR SEMICONDUCTOR DEVICE

FIELD

The present disclosure relates generally to semiconductor devices.

BACKGROUND

Power semiconductor devices are widely used to carry large currents, support high voltages and/or operate at high frequencies such as radio frequencies. A wide variety of power semiconductor devices are available for different applications including, for example, power switching devices and power amplifiers. Many power semiconductor devices are implemented using various types of field effect transistors (FETs) devices including MOSFETs (metal-oxide semiconductor field-effect transistors), DMOS (double-diffused metal-oxide semiconductor) transistors, HEMTs (high electron mobility transistors), MESFETs (metal-semiconductor field-effect transistors), LDMOS (laterally diffused metal-oxide semiconductor) transistors, etc.

Power semiconductor devices may be fabricated from wide bandgap semiconductor materials (e.g., having a bandgap greater than 1.40 eV). For example, power HEMTs may be fabricated from gallium nitride (GaN) or other Group III nitride-based material systems that are formed, for instance, on a silicon carbide (SiC) substrate or other substrate. As used herein, the term "Group III nitride" refers to those semiconducting compounds formed between nitrogen and the elements in Group III of the periodic table, usually aluminum (Al), gallium (Ga), and/or indium (In). These compounds have empirical formulas in which one mole of nitrogen is combined with a total of one mole of the Group III elements. For high power, high temperature, and/or high frequency applications, devices formed in wide bandgap semiconductor materials such as silicon carbide (e.g., 2.996 eV bandgap for alpha silicon carbide at room temperature) and the Group III-nitrides (e.g., 3.36 eV bandgap for gallium nitride at room temperature) may provide higher electric field breakdown strengths and higher electron saturation velocities as compared to gallium arsenide (GaAs) and silicon (Si) based devices.

SUMMARY

Aspects and advantages of embodiments of the present disclosure will be set forth in part in the following description, or may be learned from the description, or may be learned through practice of the embodiments.

One example aspect of the present disclosure is directed to a semiconductor device. The semiconductor device includes a Group III-nitride semiconductor structure. The semiconductor device may include a gate contact on the Group III-nitride semiconductor structure. The semiconductor device may include a field plate overlapping the Group III-nitride semiconductor structure. The semiconductor device may include a thermally conductive passivation layer overlapping the gate contact. The thermally conductive passivation layer may be between the field plate and the Group III-nitride semiconductor structure. The thermally conductive passivation layer may contact the Group III-nitride semiconductor structure. The thermally conductive passivation layer may have a thermal conductivity of at least about 80 W/(m·k).

Another example aspect of the present disclosure is directed to a semiconductor device. The semiconductor device includes a Group III-nitride semiconductor structure. The semiconductor device includes a gate contact on the Group III-nitride semiconductor structure. The semiconductor device includes a field plate overlapping the Group III-nitride semiconductor structure. The semiconductor device includes a heat spreading structure overlapping both the gate contact and the field plate. The heat spreading structure has a thermal conductivity of at least about 80 W/(m·k).

Another example aspect of the present disclosure is directed to a semiconductor die. The semiconductor die includes a substrate. The semiconductor die includes a Group III-nitride semiconductor structure having an active region. The active region is associated with one or more unit device cells. Each unit device cell includes a transistor device. The semiconductor die includes a heat spreading structure on the Group III-nitride semiconductor structure. The heat spreading structure includes one or more of diamond, silicon carbide, aluminum nitride, boron nitride, or beryllium oxide. The semiconductor die includes one or more vias thermally coupling the heat spreading structure to the substrate.

Another example aspect of the present disclosure is directed to a method. The method includes forming a Group III-nitride semiconductor structure. The method includes forming a gate contact on the Group III-nitride semiconductor structure. The method includes forming a field plate overlapping the Group III-nitride semiconductor structure. The method includes forming a thermally conductive passivation layer overlapping the gate contact. The thermally conductive passivation layer is between the field plate and the Group III-nitride semiconductor structure. The thermally conductive passivation layer directly contacts the Group III-nitride semiconductor structure. The thermally conductive passivation layer has a thermal conductivity of at least about 80 W/(m·k).

Another example aspect of the present disclosure is directed to a method. The method includes forming a Group III-nitride semiconductor structure. The method includes forming a gate contact on the Group III-nitride semiconductor structure. The method includes forming a field plate overlapping the Group III-nitride semiconductor structure. The method includes forming a heat spreading structure overlapping both the gate contact and the field plate. The heat spreading structure has a thermal conductivity of at least about 80 W/(m·k).

These and other features, aspects and advantages of various embodiments will become better understood with reference to the following description and appended claims. The accompanying drawings, which are incorporated in and constitute a part of this specification, illustrate embodiments of the present disclosure and, together with the description, explain the related principles.

BRIEF DESCRIPTION OF THE DRAWINGS

Detailed discussion of embodiments directed to one of ordinary skill in the art is set forth in the specification, which refers to the appended figures, in which.

DETAILED DESCRIPTION

Figure 1:
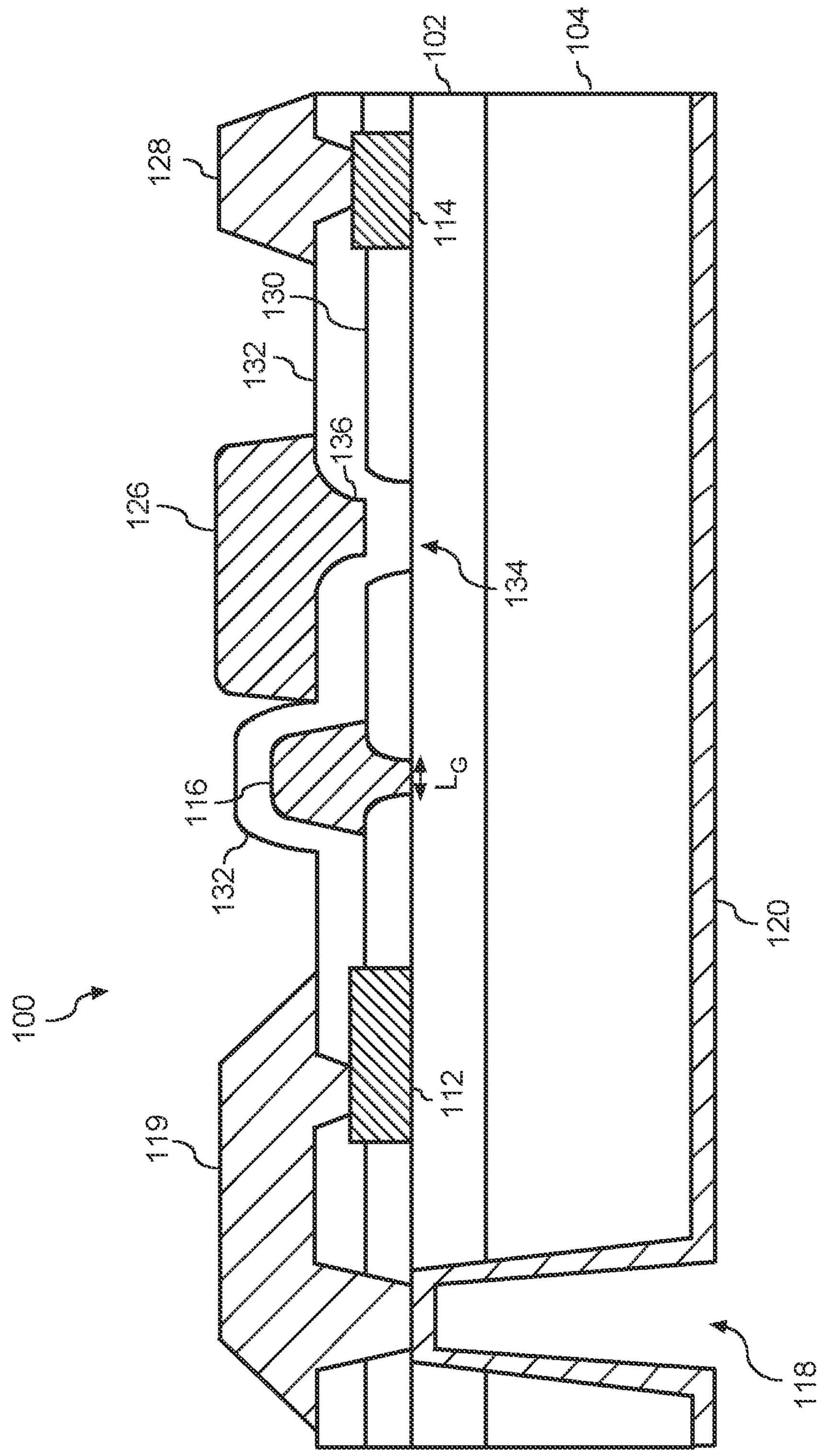
FIG. 1 depicts a cross-sectional view of an example semiconductor device according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Semiconductor devices, such as high electron mobility transistors (HEMTs), may be used in radio frequency (RF) and power electronics applications. HEMTs fabricated in Group III nitride-based material systems may have the potential to generate large amounts of radio frequency (RF) power because of the combination of material characteristics that includes high breakdown fields, wide bandgaps, large conduction band offset, and/or high saturated electron drift velocity. As such, Group III nitride based HEMTs may be promising candidates for high frequency and/or high-power RF applications, as well as for low frequency high power switching applications, both as discrete transistors or as coupled with other circuit elements, such as in monolithic microwave integrated circuit (MMIC) devices.

Transistor devices such as HEMT devices may be classified into depletion mode and enhancement mode types, corresponding to whether the transistor is in an ON-state or an OFF-state at a gate-source voltage of zero. In enhancement mode devices, the devices are OFF at zero gate-source voltage, whereas in depletion mode devices, the device is ON at zero gate-source voltage. Often, high performance Group III nitride-based HEMT devices may be implemented as depletion mode (normally-on) devices, in that they are conductive at a gate-source bias of zero due to the polarization-induced charge at the interface of the barrier and channel layers of the device.

When an HEMT device is in an ON-state, a two-dimensional electron gas (2DEG) is formed at the heterojunction of two semiconductor materials with different bandgap energies, where the smaller bandgap material has a higher electron affinity. The 2DEG is an accumulation layer in the smaller bandgap material and can include a very high sheet electron concentration. Additionally, electrons that originate in the wider-bandgap semiconductor material transfer to the 2DEG layer, allowing high electron mobility due to reduced ionized impurity scattering. This combination of high carrier concentration and high carrier mobility may give the HEMT device a very large transconductance (which may refer to the relationship between output current and input voltage) and may provide a strong performance advantage over MOSFETs for high-frequency applications.

Operating semiconductor devices, such as HEMTs, at higher operational frequencies (e.g., operational frequencies of about 8 GHz or greater) may lead to increased power density requirements for the semiconductor devices. The increased power density may result in increased heat generation in the semiconductor devices. This may cause increased operating junction temperatures for the semiconductor devices, potentially leading to thermal degradation of the semiconductor devices. Semiconductor die having semiconductor devices, such as HEMTs, may provide for thermal cooling of the semiconductor device through the substrate on which the semiconductor device is formed and the backside of the semiconductor device.

Aspects of the present disclosure are directed to providing cooling through the topside of semiconductor devices, such as HEMTs. More particularly, semiconductor devices may include one or more layers of high thermal conductivity on the topside of the semiconductor devices to extract heat out of the topside of the semiconductor devices.

In some examples, the one or more layers of high thermal conductivity may be, for instance, non-electrically conductive (e.g., electrically insulating). In some examples, the one or more layers of high thermal conductivity are non-metal. The one or more layers may have a thermal conductivity of at least about 80 W/(m·k), such as at least about 100 W/(m·k). In some examples, the one or more layers of high thermal conductivity may have a dielectric constant, for instance, in a range of about 3.9 to about 30. The one or more layers of high thermal conductivity may have a breakdown field strength of about 3 MV/cm. In some examples, the one or more layers of high thermal conductivity may include one or more of silicon carbide (SiC), aluminum nitride (AlN), diamond, boron nitride (BN), and/or beryllium oxide (BeO).

In some examples, the one or more layers of high thermal conductivity may include a thermally conductive passivation layer. The thermally conductive passivation layer may be a thin film layer that directly contacts a Group III-nitride structure. In this way, the thermally conductive passivation layer may provide a thermally conductive path to extract heat from the Group III-nitride semiconductor structure through a topside of the semiconductor device.

For instance, a semiconductor device (e.g., an HEMT), may include a Group III-nitride semiconductor structure. The semiconductor device may include a gate contact on the Group III-nitride semiconductor structure. The semiconductor device may include a field plate overlapping the Group III-nitride semiconductor structure. The semiconductor device may include a thermally conductive passivation layer overlapping the gate contact. The thermally conductive passivation layer may be between the field plate and the Group III-nitride semiconductor structure. The thermally conductive passivation layer may directly contact the Group III-nitride semiconductor structure.

For instance, in some examples, the semiconductor device may include a surface dielectric layer (e.g., silicon nitride) on the Group III-nitride semiconductor structure. The surface dielectric layer may have one or more recesses extending to the Group III-nitride semiconductor structure. The thermally conductive passivation layer may be in the recess such that the thermally conductive passivation layer directly contacts the Group III-nitride semiconductor structure. In some examples, the thermally conductive passivation layer may have a thickness, for instance, in a range of about 50 nm to about 300 nm, such as about 50 nm to about 100 nm.

In addition, and/or in the alternative, the one or more layers of high thermal conductivity may include a heat spreading structure. The heat spreading structure may overlap a gate contact and/or a field plate of a semiconductor device. The heat spreading structure may provide a thermally conductive path to extract heat through a topside of the semiconductor device.

The heat spreading structure may include one or more heat spreading layers. The heat spreading layers may overlap the gate contact and/or the field plate. The heat spreading structure may have a thickness in a range of about 1 micron to about 100 microns, such as in a range of about 1 micron to about 10 microns, such as in a range of about 2 microns to about 4 microns. In some examples, one or more vias may be used to thermally couple the heat spreading structure to a substrate on which the semiconductor device is formed, such as a silicon carbide substrate.

Aspects of the present disclosure provide a number of technical effects and benefits. For instance, the one or more layers of high thermal conductivity on the topside of the semiconductor device may provide for an additional cooling path to extract heat from the semiconductor device during operation, such as operations at frequencies in a range of about 8 GHz or greater. This can allow for lower junction temperatures of the semiconductor device during operation. The lower junction temperatures of the semiconductor device may reduce thermal stress on the device, enhancing reliability and prolonging lifespan. Lower junction temperatures may improve the overall semiconductor device performance by reducing self-heating effects, leading to higher power output, better linearity, and improved efficiency.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, a first structure "overlaps" or is "overlapping with" a second structure if an axis that is perpendicular to a major surface of the first structure passes through both the first structure and the second structure.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the disclosure are described herein with reference to cross-section illustrations that are schematic illustrations of idealized embodiments (and intermediate structures) of the disclosure. The thickness of layers and regions in the drawings may be exaggerated for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Similarly, it will be understood that variations in the dimensions are to be expected based on standard deviations in manufacturing procedures. As used herein, "approximately" or "about" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the disclosure are described with reference to semiconductor layers and/or regions which are characterized as having a conductivity type such as n type or p type, which refers to the majority carrier concentration in the layer and/or region. Thus, N type material has a majority equilibrium concentration of negatively charged electrons, while P type material has a majority equilibrium concentration of positively charged holes. Some material may be designated with a "+" or "−" (as in N+, N−, P+, P−, N++, N−−, P++, P−−, or the like), to indicate a relatively larger ("+") or smaller ("−") concentration of majority carriers compared to another layer or region. However, such notation does not imply the existence of a particular concentration of majority or minority carriers in a layer or region.

As used herein, the term "Group III nitride" refers to those semiconducting compounds formed between nitrogen (N) and the elements in Group III of the periodic table, usually aluminum (Al), gallium (Ga), and/or indium (In). The term also refers to ternary and quaternary (or higher) compounds such as, for example, AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Group III-nitride structures may be metal-polar. However, aspects of the present disclosure are applicable to semiconductor devices having N-polar semiconductor structures without deviating from the scope of the present disclosure.

Aspects of the present disclosure are discussed with reference to an HEMT transistor device for purposes of illustration and discussion. Those of ordinary skill in the art, using the disclosures provided herein, will appreciate that certain aspects of the present disclosure may be applicable to other transistor devices without deviating from the scope of the present disclosure.

In the drawings and specification, there have been disclosed typical embodiments and, although specific terms are employed, they are used in a generic and descriptive sense only and not for purposes of limitation of the scope set forth in the following claims.

With reference now to the Figures, example embodiments of the present disclosure will now be set forth.

Figure 2:
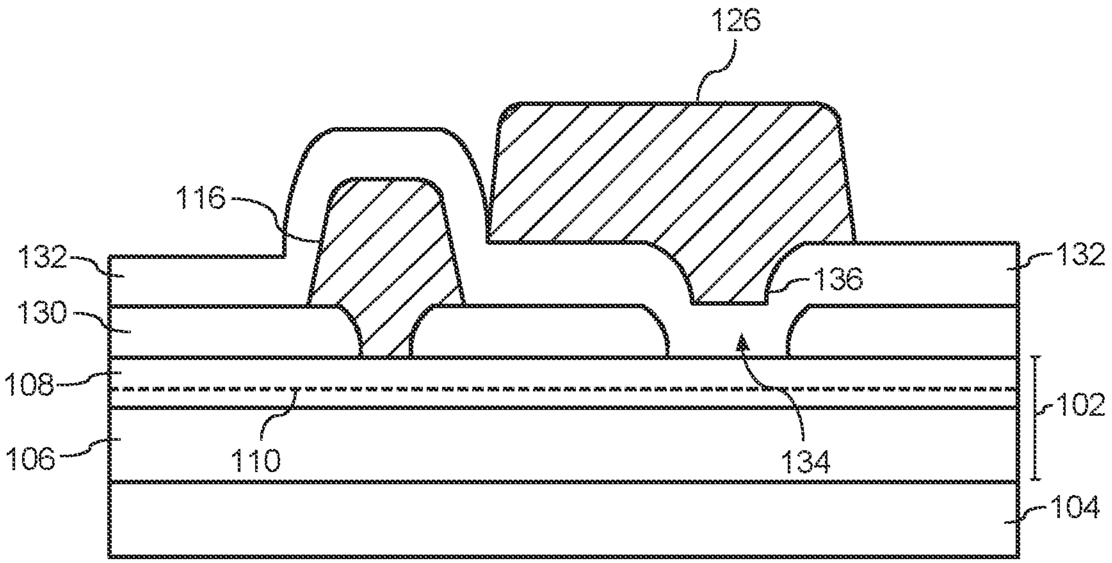
FIG. 2 depicts a close-up cross-sectional view of an example semiconductor device according to example embodiments of the present disclosure.

FIGS. 1-2 depict aspects of an example semiconductor device according to example embodiments of the present disclosure. More particularly, FIG. 1 depicts a cross-sectional view of an example HEMT device 100 according to example embodiments of the present disclosure. FIG. 2 depicts a close-up view of aspects of the HEMT device 100 of FIG. 1. FIGS. 1-2 are intended to represent structures for identification and description and are not intended to represent the structures to physical scale.

Referring to FIG. 1, the HEMT device 100 may include a semiconductor structure 102. The semiconductor structure 102 may be a Group III-nitride semiconductor structure.

The semiconductor structure 102 may be on a substrate 104. The substrate 104 may be a semiconductor material. For instance, the substrate 104 may be a silicon substrate, a silicon carbide (SiC) substrate, a sapphire substrate, or other suitable substrate. In some embodiments, the substrate 104 may be a semi-insulating SiC substrate that may be, for example, the 4H polytype of silicon carbide. Other SiC candidate polytypes may include the 3C, 6H, and 15R polytypes. The substrate may be a High Purity Semi-Insulating (HPSI) substrate, available from Wolfspeed, Inc. The term "semi-insulating" is used descriptively herein, rather than in an absolute sense.

In some embodiments, the SiC bulk crystal of the substrate 104 may have a resistivity equal to or higher than about $1\times10^5$ ohm-cm at room temperature. Example SiC substrates that may be used in some embodiments are manufactured by, for example, Wolfspeed, Inc., and methods for producing such substrates are described, for example, in U.S. Pat. No. Re. 34,861, U.S. Pat. Nos. 4,946,547, 5,200,022, and 6,218,680, the disclosures of which are incorporated by reference herein. Although SiC may be used as a substrate material, embodiments of the present disclosure may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like. The substrate 104 may be a SiC wafer, and the HEMT device 100 may be formed, at least in part, via wafer-level processing, and the wafer may then be diced to provide a plurality of individual HEMT devices 100 that may include one or more transistor cells.

In some embodiments, the substrate 104 of the HEMT device 100 may be a thinned substrate 104. In some embodiments, the thickness of the substrate 104 (e.g., in a vertical Z direction in FIG. 1) may be about 100 microns or less, such as about 75 microns or less, such as about 50 microns or less.

FIG. 2 depicts a cross-sectional view of the semiconductor structure 102 on the substrate 104. The semiconductor structure 102 may include a channel layer 106 on an upper surface of the substrate 104 (or on the optional layers described further herein, such as an optional buffer or nucleation layer). The semiconductor structure 102 may include a barrier layer 108 on an upper surface of the channel layer 106. In some embodiments, the channel layer 106 and the barrier layer 108 may each be formed by epitaxial growth. Techniques for epitaxial growth of Group III-nitrides have been described in, for example, U.S. Pat. Nos. 5,210,051, 5,393,993, and 5,523,589, the disclosures of which are incorporated by reference herein. The channel layer 106 may have a bandgap that is less than the bandgap of the barrier layer 108. The channel layer 106 may have a larger electron affinity than the barrier layer 108. The channel layer 106 and the barrier layer 108 may include Group III nitride-based materials.

In some embodiments, the channel layer 106 may be a Group III-nitride, such as $Al_xGa_{1-x}N$, where $0\leq x<0.10$, provided that the energy of the conduction band edge of the channel layer 106 is less than the energy of the conduction band edge of the barrier layer 108 at the interface between the channel layer 106 and barrier layer 108. In some embodiments, the aluminum mole fraction x is approximately 0 (e.g., less than 5%, such as 0%), indicating that the channel layer 106 is GaN. The channel layer 106 may or may not include other Group III-nitrides such as InGaN, AlInGaN or the like. The channel layer 106 may be undoped ("unintentionally doped"). In some examples, the channel layer 106 may be doped, for instance with iron (Fe). The channel layer 106 may have a thickness of about 0.5 microns to about 5 microns, such as about 1.4 microns. The channel layer 106 may be a multi-layer structure, such as a superlattice or combinations of GaN, AlGaN or the like. The channel layer 106 may be under compressive strain in some embodiments.

The barrier layer 108 may be a Group III-nitride, such as $Al_yGa_{1-y}N$, where y is the aluminum mole fraction in the barrier layer 108. The energy of the conduction band edge of the barrier layer 108 is greater than the energy of the conduction band edge of the channel layer 106 at the interface between the channel layer 106 and barrier layer 108. In some embodiments, the aluminum mole fraction y is such that y is in a range of about 0.15 to about 0.40, such as about 0.20 to about 0.25, such as about 0.22, indicating that the barrier layer is an AlGaN layer. The barrier layer 108 may include other Group III elements (e.g., In) without deviating from the scope of the present disclosure. The barrier layer 108, in some examples, may be a multilayer structure. The multilayer structure may include multiple Group III nitride-based layers with differing aluminum mole fractions. The barrier layer 108 may have a thickness in a range of about 10 Angstroms to about 300 Angstroms, such as about 120 Angstroms to about 170 Angstroms, such as about 150 Angstroms. The channel layer 106 and/or the barrier layer 108 may be deposited, for example, by metal-organic chemical vapor deposition (MOCVD), molecular beam epitaxy (MBE), or hydride vapor phase epitaxy (HVPE).

A 2DEG 110 may be induced in the channel layer 106 at an interface between the channel layer 106 and the barrier layer 108. The 2DEG 110 is highly conductive and allows conduction between the source and drain regions of the HEMT device 100.

While the HEMT device 100 of FIGS. 1-2 is shown with a substrate 104, channel layer 106 and barrier layer 108 for purposes of illustration, the HEMT device 100 may include additional layers/structures/elements. For instance, the HEMT device 100 may include a buffer layer(s)/nucleation layer(s)/transition layer(s) between substrate 104 and the channel layer 106. For example, an AlN buffer layer may be on the upper surface of the substrate 104 to provide an appropriate crystal structure transition between a silicon carbide substrate 104 and the channel layer 106. The optional buffer/nucleation/transition layers may be deposited by MOCVD, MBE, and/or HVPE.

The HEMT device 100 may include a cap layer (not illustrated) on the barrier layer 108. HEMT structures including substrates, channel layers, barrier layers, and other layers are discussed by way of example in U.S. Pat. Nos. 5,192,987, 5,296,395, 6,316,793, 6,548,333, 7,544,963, 7,548,112, 7,592,211, 7,615,774, 7,709,269, 7,709,859 and 10,971,612, the disclosures of which are incorporated by reference herein. Additionally, strain balancing transition layer(s) may also and/or alternatively be provided as described, for example, in U.S. Pat. No. 7,030,428, the disclosure of which is incorporated by reference herein.

Referring to FIG. 1, the HEMT device 100 may include a source contact 112 on the semiconductor structure 102 or otherwise contacting the semiconductor structure 102. The HEMT device 100 may include a drain contact 114 on the semiconductor structure 102 or otherwise contacting the semiconductor structure 102. The source contact 112 and the drain contact 114 may be laterally spaced apart from each other. In some embodiments, the source contact 112 and the drain contact 114 may include a metal that may form an ohmic contact to a Group III nitride-based semiconductor material. Suitable metals may include refractory metals, such as titanium (Ti), tungsten (W), titanium tungsten (TiW), silicon (Si), titanium tungsten nitride (TiWN), tungsten silicide (WSi), rhenium (Re), niobium (Nb), nickel (Ni), gold (Au), aluminum (Al), tantalum (Ta), molybdenum (Mo), nickel silicide ($NiSi_x$), titanium silicide (TiSi), titanium nitride (TiN), tungsten silicon nitride (WSiN), platinum (Pt) and the like. In some embodiments, the source contact 112 may be an ohmic source contact 112. The drain contact 114 may be an ohmic drain contact 114. Thus, the source contact 112 and/or the drain contact 114 may include an ohmic contact portion in direct contact with the barrier layer 108. In some embodiments, the source contact 112 and/or the drain contact 114 may include a plurality of layers to form an ohmic contact that may be provided as described, for example, in U.S. Pat. Nos. 8,563,372 and 9,214,352, the disclosures of which are incorporated by reference herein.

The HEMT device 100 may include a gate contact 116 on the semiconductor structure 102 or otherwise contacting the semiconductor structure 102 (e.g., at least partially recessed into the semiconductor structure 102). The gate contact 116 may have a gate length $L_G$. The gate length $L_G$ may be the length of the gate contact 116 along the portion of the gate contact 116 that is on the semiconductor structure 102 in a direction extending between the source contact 112 and the drain contact 114 (e.g., the length of the lowermost portion of the gate contact 116 in contact with the semiconductor structure 102). In some embodiments, the gate length $L_G$ may be about 200 nm or less, such as about 150 nm or less, such as in a range of about 60 nm to about 200 nm, such as in a range of about 90 nm to about 150 nm. In some examples, a distance between the gate contact 116 and the drain contact 114 may be, for instance, in a range of 1.8 microns to about 2.2 microns, such as about 1.98 microns. A distance between the gate contact 116 and the source contact 112 may be, for instance, in a range of about 0.4 microns to about 0.8 microns, such as about 0.6 microns.

The material of the gate contact 116 may be chosen based on the composition of the barrier layer 108, and may, in some embodiments, be a Schottky contact. Materials capable of making a Schottky contact to a Group III nitride-based semiconductor material may be used, such as, for example, nickel (Ni), platinum (Pt), nickel silicide ($NiSi_x$), copper (Cu), palladium (Pd), chromium (Cr), tungsten (W), tungsten silicon nitride (WSiN), ruthenium (Ru), and/or p-type polysilicon.

In some embodiments, the gate contact 116 may be a T-shaped gate and/or a gamma gate, the formation of which is discussed by way of example in U.S. Pat. Nos. 8,049,252, 7,045,404, and 8,120,064, the disclosures of which are incorporated by reference herein. The gate contact 116 may have an overhang portion toward the drain contact 114. The length of the overhang portion toward the drain contact 114 may be in a range of about 0.15 microns to about 0.25 microns, such as about 0.2 microns. The gate contact 116 may have an overhang portion toward the source contact 112. The length of the overhang portion toward the source contact 112 may be in a range of about 0.15 microns to about 0.25 microns, such as about 0.2 microns.

The source contact 112 may be coupled to a reference signal such as, for example, a ground voltage or other reference signal. The coupling to the reference signal may be provided by a via 118 that extends from a lower surface of the substrate 104, through the substrate 104 and semiconductor structure 102 to the upper surface of the semiconductor structure 102. The via 118 may be coupled to a source metallization contact 119. The source metallization contact 119 may include metal or other highly conductive material, including, for example, copper, cobalt, gold, and/or a composite metal. The source metallization contact 119 may conductively couple the via 118 to the source contact 112. A back metal layer 120 may be on the lower surface of the substrate 104 and on side walls of the via 118. The back metal layer 120 may be conductively coupled to the source metallization contact 119. Thus, the back metal layer 120, and a signal coupled thereto, may be electrically connected to the source contact 112 through the source metallization contact 119.

In some embodiments, the via 118 may have an oval or circular cross-section when viewed in a plan view. However, the present disclosure is not limited thereto. In some embodiments, a cross-section of the via 118 may be a polygon or other shape, as will be understood by one of ordinary skill in the art using the disclosures provided herein. In some embodiments, dimensions of the via 118 (e.g., a length and/or a width) may be such that a largest cross-sectional area of the via 118 is about 3500 $\mu m^2$ or less. The cross-sectional area may be taken in a direction that is parallel to the lower surface of the substrate 104. In some embodiments, the largest cross-sectional area of the via 118 may be that portion of the via 118 that is adjacent the lower surface of the substrate 104 (e.g., the opening of the via 118). In some embodiments, sidewalls of the via 118 may be inclined and/or slanted with respect to the lower surface 104B of the substrate 104. In some embodiments, the sidewalls of the via 118 may be approximately perpendicular to the lower surface 104B of the substrate 104.

Depending on the embodiment, the drain contact 114 may be formed on, in and/or through the semiconductor structure 102, and there may be ion implantation or other dopant implantation into the materials around the drain contact 114 to reduce resistivity and provide improved ohmic contact to the semiconductor material. In yet other embodiments, there is no source via 118, and the source contact 112 is formed on, in and/or through the semiconductor structure 102, and there may be ion implantation or other dopant implantation in the materials around the source contact 112 to reduce resistivity and to provide improved ohmic contact to the semiconductor material. Where there is no source via 118, the electrical connections to the source contact 112 may be made on the same side as the gate contact 116 and the drain contact 114. In some examples, the connections to the source contact 112, drain contact 114, and/or gate contact 116 may be made from the top and/or the bottom to provide for flip chip configuration of the HEMT device 100.

The HEMT device 100 may include one or more field plates 126. The field plate 126 may reduce the peak electric field in the HEMT device 100, which may result in increased breakdown voltage and reduced charge trapping. The reduction of the electric field may also yield other benefits such as reduced leakage currents and enhanced reliability. Field plates and techniques for forming field plates are discussed, by way of example, in U.S. Pat. No. 8,120,064, the disclosure of which is incorporated by reference herein.

The field plate 126 may be electrically coupled to the source contact 112 (e.g., through a conductive path outside an active area of the HEMT device 100). In some examples, the field plate 126 does not overlap the gate contact 116 as shown in FIGS. 1 and 2. However, in some examples, the field plate 126 may at least partially overlap the gate contact 116. The field plate 126 may be a metal or other highly conductive material, including, for example, copper, cobalt, gold, and/or a composite metal. As shown in FIGS. 1 and 2, the field plate 126 may be recessed toward the barrier layer 108.

The HEMT device 100 may include metal contacts, such as source metallization contact 119 and drain metallization contact 128. The source metallization contact 119 may be conductively coupled to the source contact 112. The drain metallization contact 128 may be conductively coupled to the drain contact 114. The source metallization contact 119 and the drain metallization contact 128 may include metal or other highly conductive material, including, for example, copper, cobalt, gold, and/or a composite metal.

The HEMT device 100 may include a surface dielectric layer 130 on the semiconductor structure 102. The surface dielectric layer 130 may directly contact the upper surface of the semiconductor structure 102. In some examples, at least a portion of the surface dielectric layer 130 may be between the semiconductor structure 102 and at least a portion of the gate contact 116. For instance, at least a portion of the surface dielectric layer 130 may be between the semiconductor structure 102 and an overhang of the gate contact 116.

The surface dielectric layer 130 may have a thickness of about 145 nm or less, such as in a range of about 80 nm to about 145 nm, such as about 120 nm. In this way, the overhang of the T-shaped or Gamma-shaped gate contact 116 may be separated from the semiconductor structure 102 by a distance approximately equal to the thickness of the surface dielectric layer 130. The surface dielectric layer 130 may be a silicon nitride (SiN) layer. Other suitable dielectric materials may be used without deviating from the scope of the present disclosure. For instance, the surface dielectric layer 130 may be $SiO_2$, MgOx, MgNx, ZnO, SiNx, SiOx, alloys or layer sequences thereof, or epitaxial materials.

The surface dielectric layer 130 may include a recess 134 (e.g., a field plate recess). The recess 134 shown in FIGS. 1 and 2 is on a drain side of the gate contact 116. The recess 134 may be between the field plate 126 and the semiconductor structure 102. An extending portion 136 of the field plate 126 may extend towards and/or at least partially into the recess 134 such that the extending portion 136 of the field plate 126 is closer to the semiconductor structure 102 relative to the remainder of the field plate 126.

Figure 3:
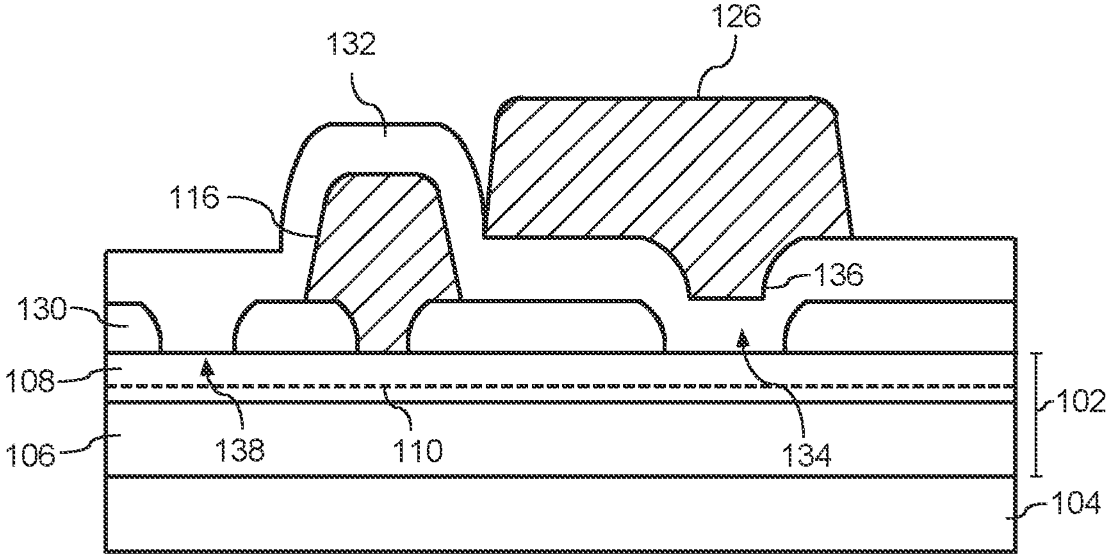
FIG. 3 depicts a close-up cross-sectional view of an example semiconductor device according to example embodiments of the present disclosure.

In addition, or in the alternative, the surface dielectric layer 130 may include one or more recess(s) in other locations. For instance, as shown in FIG. 3, the surface dielectric layer 130 includes the recess 134 on the drain side of the gate contact 116. The surface dielectric layer 130 also includes a recess 138 on a source side of the gate contact 116.

Referring to FIGS. 1-3, according to example aspects of the present disclosure, the HEMT device 100 includes a thermally conductive passivation layer 132. The thermally conductive passivation layer 132 is on the surface dielectric layer 130. In addition, the thermally conductive passivation layer 132 directly contacts the semiconductor structure 102. More particularly, the thermally conductive passivation layer 132 may fill the recess 134 (FIG. 2) and/or the recess 138 (FIG. 3) such that the thermally conductive passivation layer 132 directly contacts the semiconductor structure 102.

The thermally conductive passivation layer 132 may be a material with a high conductivity, such as about 80 W/(m·k) or greater, such as about 100 W/(m·k) or greater. The thermally conductive passivation layer 132 may be non-metal. The thermally conductive passivation layer 132 may be, for instance, a dielectric material. In some examples, the thermally conductive passivation layer 132 has a dielectric constant of about 3.9 or greater, such as in a range of about 3.9 to about 30. In some examples, the thermally conductive passivation layer 132 has a breakdown field strength of about 3 MV/cm or greater. In some examples, the thermally conductive passivation layer 132 may have a thickness of about 50 nm to about 300 nm, such as about 50 nm to about 100 nm. In some examples, the thermally conductive passivation layer 132 may be aluminum nitride. In some examples, the thermally conductive passivation layer 132 may be silicon carbide, diamond, boron nitride, or beryllium oxide.

An HEMT transistor cell may be formed by the active region between the source contact 112 and the drain contact 114 under the control of the gate contact 116 between the source contact 112 and the drain contact 114. FIG. 1 depicts a cross-sectional view of one unit or cell of an HEMT device 100 for purposes of illustration. The HEMT device unit or cell may be formed adjacent to additional HEMT device cells and may share, for instance, a source contact 112 with adjacent HEMT device cells. The HEMT device 100 may be formed, at least in part, via wafer-level processing, and the wafer may then be diced to provide a plurality of individual HEMT devices 100.

Figure 4:
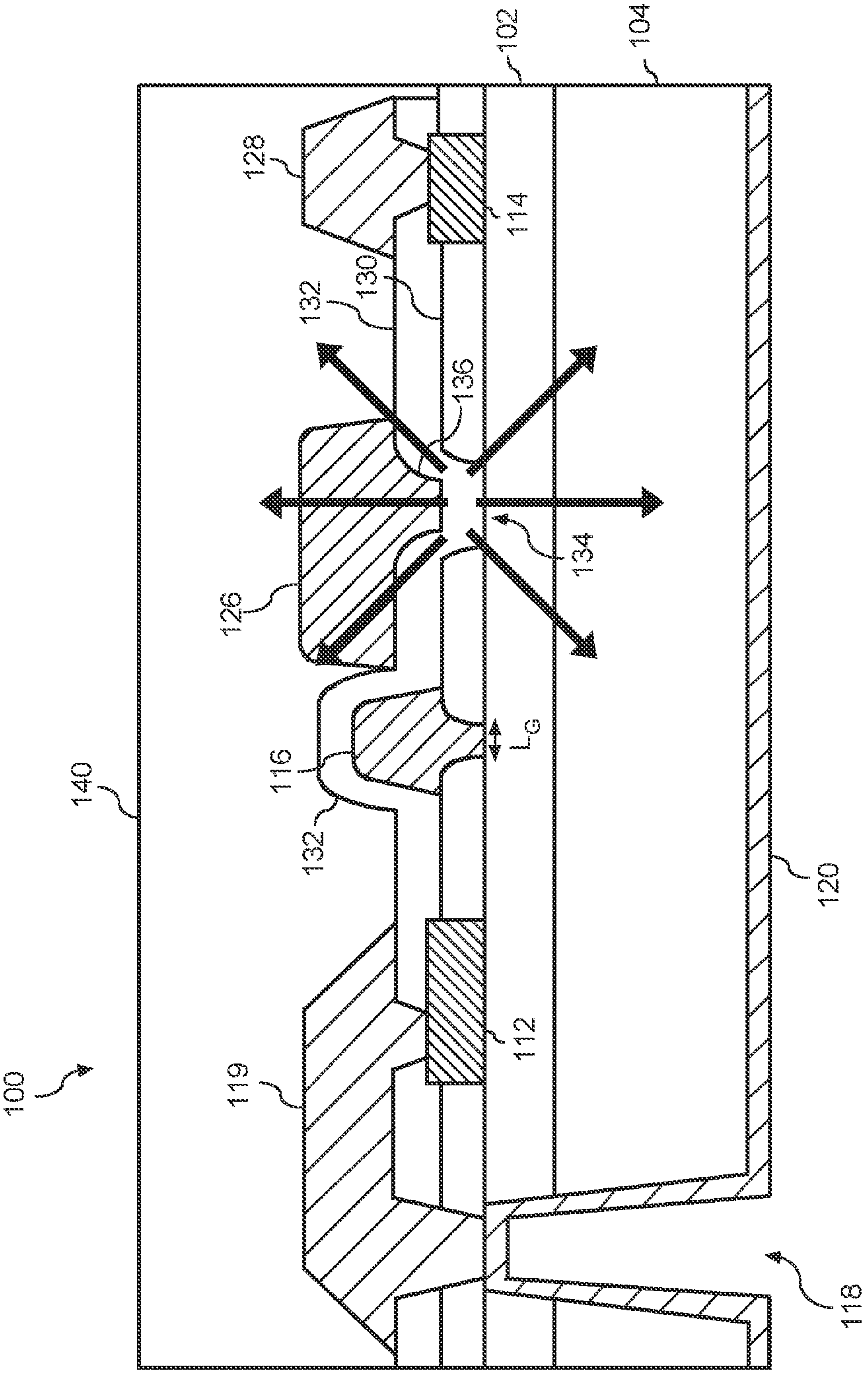
FIG. 4 depicts a cross-sectional view of an example semiconductor device according to example embodiments of the present disclosure.

FIG. 4 depicts an HEMT device 100 that is similar to the HEMT device 100 of FIGS. 1-3. However, the HEMT device of FIG. 4 additionally includes a heat spreading structure 140. The heat spreading structure 140 overlaps the gate contact 116 and the field plate 126. In some examples, the heat spreading structure 140 at least partially overlaps the source metallization contact 119 and the drain metallization contact 128.

The heat spreading structure 140 may include one or more heat spreading layers. Each of the heat spreading layers of the heat spreading structure 140 may be a layer of high thermal conductivity. In some examples, the one or more layers of the heat spreading structure 140 may include a material with a high conductivity, such as about 80 W/(m·k) or greater, such as about 100 W/(m·k) or greater. The one or more layers of the heat spreading structure 140 may be non-metal. The one or more layers of the heat spreading structure 140 may be, for instance, a dielectric material. In some examples, the one or more layers of the heat spreading structure 140 have a dielectric constant of about 3.9 or greater, such as in a range of about 3.9 to about 30. In some examples, the one or more layers of the heat spreading structure 140 have a breakdown field strength of about 3 MV/cm or greater. In some examples, the heat spreading structure 140 may have a thickness of about 1 micron to about 100 microns, such as about 1 micron to about 10 microns, such as about 2 microns to about 4 microns. In some examples, the one or more layers of the heat spreading structure 140 may be diamond. In some examples, the one or more layers of the heat spreading structure 140 may be silicon carbide, aluminum nitride, boron nitride, or beryllium oxide.

The one or more layers of the heat spreading structure 140 may be the same material or a different material relative to the thermally conductive passivation layer 132. For instance, in some examples, the thermally conductive passivation layer 132 may include aluminum nitride and the heat spreading structure 140 may include diamond.

The arrows in FIG. 4 indicate cooling paths for the HEMT device 100. As illustrated, the HEMT device 100 has cooling paths through the substrate 104 (e.g., silicon carbide substrate) of the HEMT device 100 to provide bottom side cooling. The HEMT device 100 has cooling paths through the thermally conductive passivation layer 132 and the heat spreading structure 140 to extract heat from the HEMT device 100 toward a top side of the HEMT device 100. In this way, the HEMT device 100 may provide for enhanced cooling and improved junction temperatures of the HEMT device 100 during operation (e.g., operation at high frequencies, such as at about 8 GHz or greater).

Figure 5:
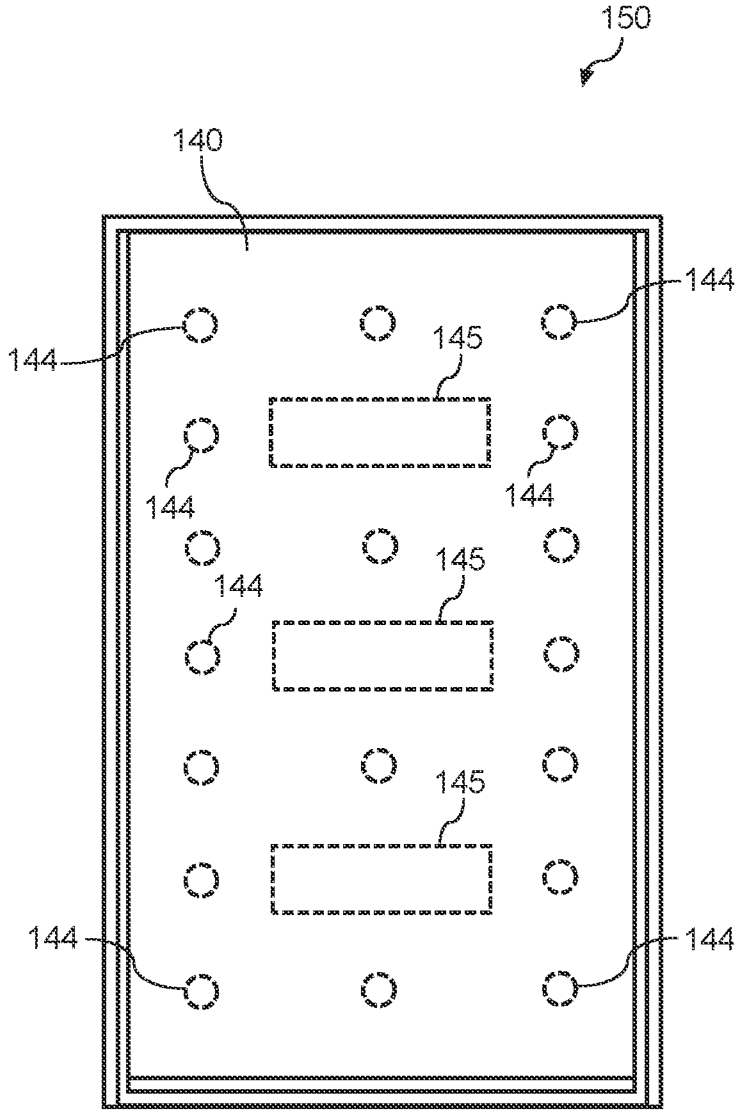
FIG. 5 depicts a plan view of an example semiconductor die according to example embodiments of the present disclosure.

FIG. 5 depicts an example semiconductor die 150 that includes HEMT unit cell devices with a heat spreading structure 140 as described with respect to FIG. 4. More particularly, the semiconductor die 150 may include one or more active regions 145. The active regions 145 may have one or more unit device cells including an HEMT device 100 as described with respect to the examples in FIGS. 1-4. The heat spreading structure 140 may cover and/or overlap the active regions 145.

The semiconductor die 150 may include one or more vias 144 (illustrated in dashed line). Representative vias are labeled with reference numeral 144 for sake of clarity. All dashed circular lines in FIG. 5 are intended to represent a via 144. The one or more vias may thermally couple the heat spreading structure to the substrate 104 (e.g., silicon carbide substrate) on which the unit device cells including an HEMT device 100 are formed. Each of the one or more vias 144 may include a thermally conductive material, such as a metal.

FIG. 5 depicts one example pattern of vias 144 for purposes of illustration and discussion. Those of ordinary skill in the art, using the disclosures provided herein, will understand that any suitable pattern of vias 144 may be included in the semiconductor die 150 without deviating from the scope of the present disclosure. In addition, FIG. 5 depicts eighteen vias 144 for purposes of illustration and discussion. Those of ordinary skill in the art, using the disclosures provided herein, will understand that any number of vias 144 may be included in the semiconductor die 150 without deviating from the scope of the present disclosure.

Figure 6:
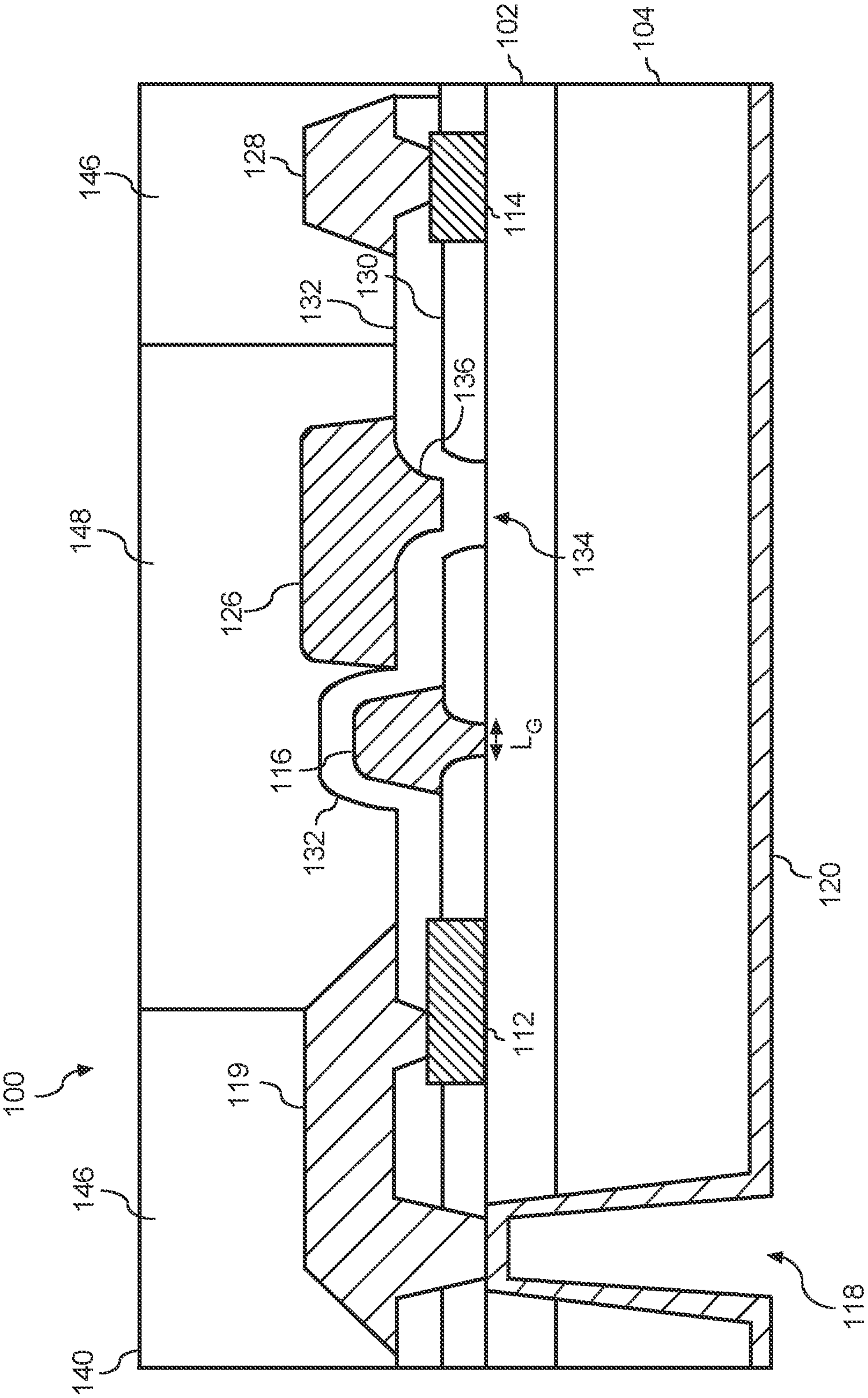
FIG. 6 depicts a cross-sectional view of an example semiconductor device according to example embodiments of the present disclosure.

FIG. 6 depicts an HEMT device 100 that is similar to the HEMT device 100 of FIGS. 1-4. The HEMT device of FIG. 6 additionally includes a heat spreading structure 140. The heat spreading structure 140 overlaps the gate contact 116 and the field plate 126. In some examples, the heat spreading structure 140 at least partially overlaps the source metallization contact 119 and the drain metallization contact 128.

The heat spreading structure 140 of FIG. 6 is patterned to have first portion 146 and a second portion 148. Each of the first portion 146 and the second portion 148 may include a thermally conductive material. However, the first portion 146 may have a different thermal conductivity relative to the second portion 148. For instance, the second portion 148 may have a greater thermal conductivity relative to the first portion 146.

As illustrated, the second portion 148 is overlapping an active region of the HEMT device 100. The first portion 146 is overlapping other portions of the HEMT device 100. In this way, the second portion 148 with higher thermal conductivity may be located over the active region of the HEMT device 100 to provide for enhanced cooling of the active region relative to other portions of the HEMT device 100.

The heat spreading structure 140, including the first portion 146 and the second portion 148, may include one or more heat spreading layers. Each of the heat spreading layers of the heat spreading structure 140 may be a layer of high thermal conductivity. In some examples, the one or more layers of the heat spreading structure 140 may include a material with a high conductivity, such as about 80 W/(m·k) or greater, such as about 100 W/(m·k) or greater. The one or more layers of the heat spreading structure 140 may be non-metal. The one or more layers of the heat spreading structure 140 may be, for instance, a dielectric material. In some examples, the one or more layers of the heat spreading structure 140 have a dielectric constant of about 3.9 or greater, such as in a range of about 3.9 to about 30. In some examples, the one or more layers of the heat spreading structure 140 have a breakdown field strength of about 3 MV/cm or greater. In some examples, the heat spreading structure 140 may have a thickness of about 1 micron to about 100 microns, such as about 1 micron to about 10 microns, such as about 2 microns to about 4 microns. In some examples, the one or more layers of the heat spreading structure 140 may be diamond. In some examples, the one or more layers of the heat spreading structure 140 may be silicon carbide, aluminum nitride, boron nitride, or beryllium oxide. The first portion 146 may be a different material relative to the second portion 148.

Figure 7:
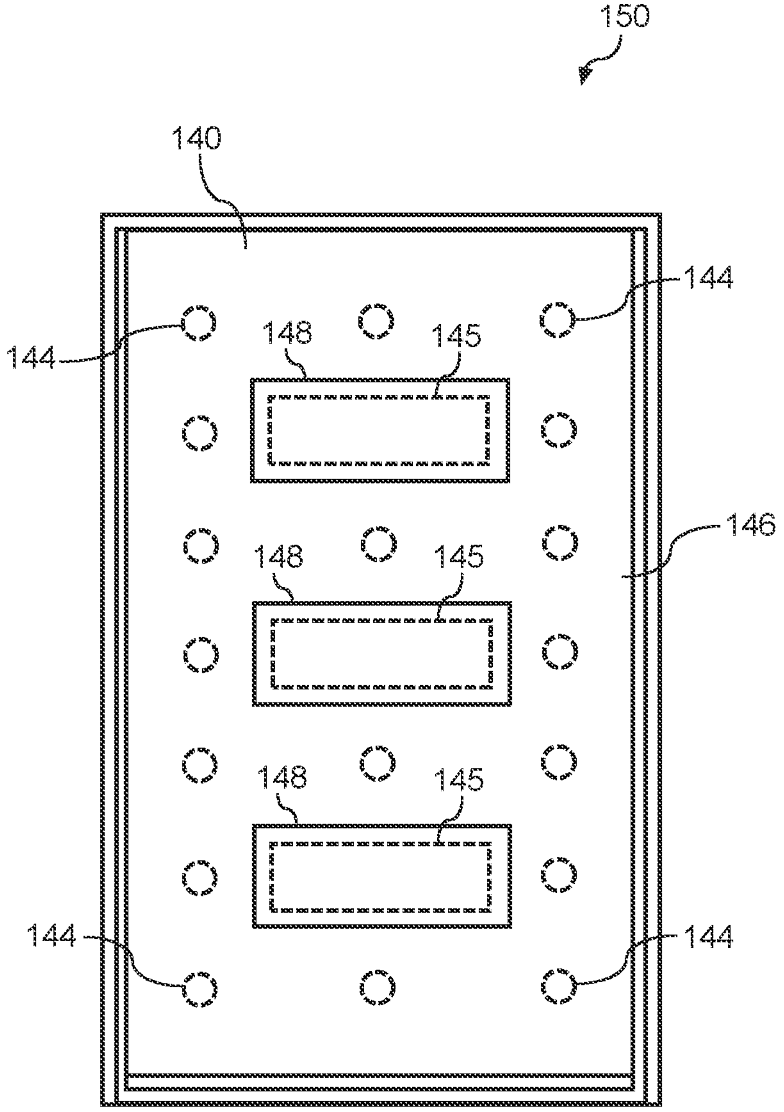
FIG. 7 depicts a plan view of an example semiconductor die according to example embodiments of the present disclosure.

FIG. 7 depicts an example semiconductor die 150 that includes HEMT unit cell devices with a heat spreading structure 140 as described with respect to FIG. 6. More particularly, the semiconductor die 150 may include one or more active regions 145. The active regions 145 may have one or more unit device cells including an HEMT device 100 as described with respect to the examples in FIGS. 1-4. The heat spreading structure 140 may cover and/or overlap the active regions 145.

The heat spreading structure 140 may be patterned to include a first portion 146 and a second portion(s) 148. As illustrated in FIG. 7, the second portion(s) 148 may be overlapping the active regions 145 of the semiconductor die 150. The second portion(s) 148 of the heat spreading structure 140 may be of a greater thermal conductivity relative to the first portion 146 of the heat spreading structure 140.

Similar to FIG. 5, the semiconductor die 150 of FIG. 7 may include one or more vias 144 (illustrated in dashed line). Representative vias are labeled with reference numeral 144 for sake of clarity. All dashed circular lines in FIG. 7 are intended to represent a via 144. The one or more vias may thermally couple the heat spreading structure to the substrate 104 (e.g., silicon carbide substrate) on which the unit device cells including an HEMT device 100 are formed. Each of the one or more vias 144 may include a thermally conductive material, such as a metal.

FIG. 7 depicts one example pattern of vias 144 for purposes of illustration and discussion. Those of ordinary skill in the art, using the disclosures provided herein, will understand that any suitable pattern of vias 144 may be included in the semiconductor die 150 without deviating from the scope of the present disclosure. In addition, FIG. 7 depicts eighteen vias 144 for purposes of illustration and discussion. Those of ordinary skill in the art, using the disclosures provided herein, will understand that any number of vias 144 may be included in the semiconductor die 150 without deviating from the scope of the present disclosure.

Figure 8:
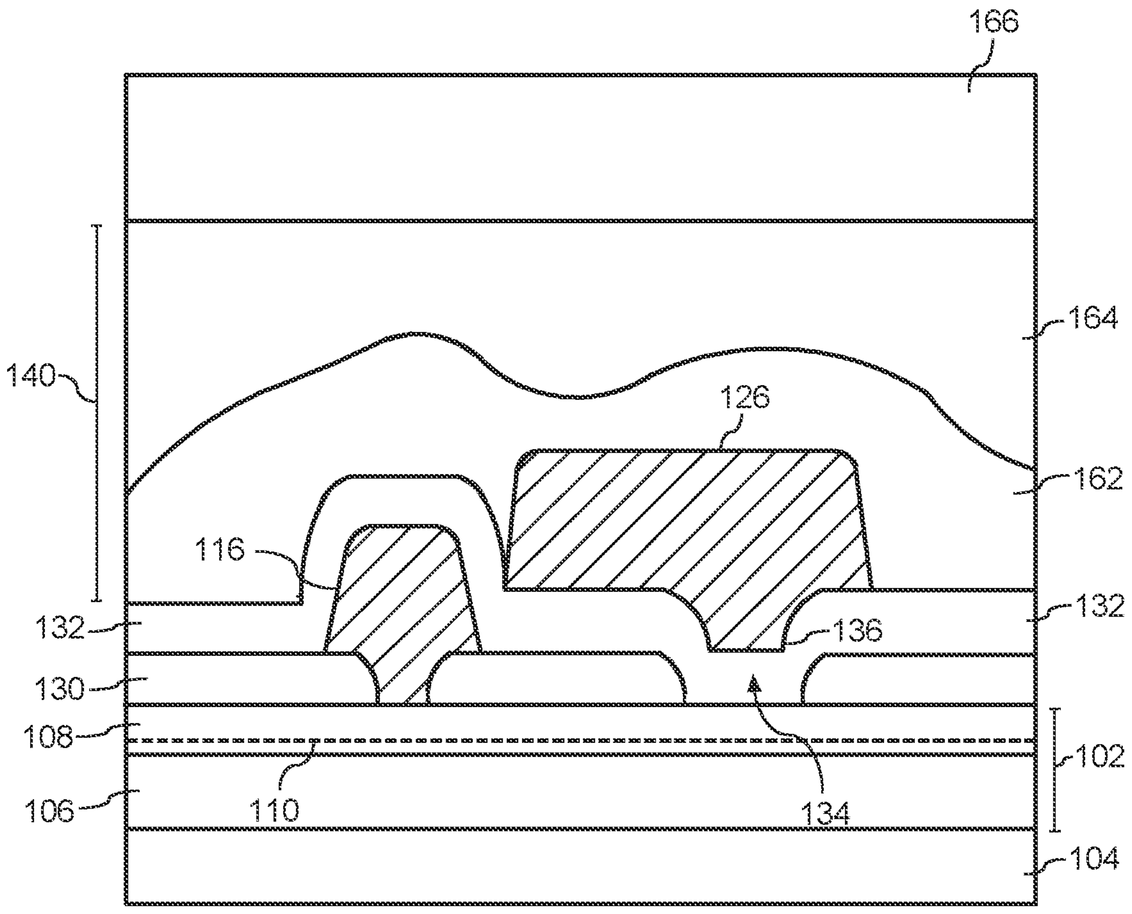
FIG. 8 depicts a close-up cross-sectional view of an example semiconductor device according to example embodiments of the present disclosure.

FIG. 8 depicts a close-up cross-sectional view of an example HEMT device 100 according to example embodiments of the present disclosure. The HEMT device 100 of FIG. 8 is similar to that of FIGS. 1-2, except that the HEMT device 100 includes a multilayer heat spreading structure 140 overlapping the gate contact 116 and the field plate 126.

More particularly, the heat spreading structure 140 may include a first layer 162 and a second layer 164. The first layer 162 may be in thermal communication with the thermally conductive passivation layer 132. The second layer 164 may be on the first layer 162. The second layer 164 may be the same material or a different material relative to the first layer 162.

In some examples, each of the first layer 162 and the second layer 164 may be a layer of high thermal conductivity. In some examples, each of the first layer 162 and the second layer 164 of the heat spreading structure 140 may include a material with a high conductivity, such as about 80 W/(m·k) or greater, such as about 100 W/(m·k) or greater. One or more of the first layer 162 and the second layer 164 may be non-metal. One or more of the first layer 162 and the second layer 164 may be, for instance, a dielectric material. In some examples, one or more of the first layer 162 and the second layer 164 may have a dielectric constant of about 3.9 or greater, such as in a range of about 3.9 to about 30. In some examples, one or more of the first layer 162 and the second layer 164 have a breakdown field strength of about 3 MV/cm or greater. In some examples, the first layer 162 and the second layer 164 of the heat spreading structure 140 may be diamond, silicon carbide, aluminum nitride, boron nitride, or beryllium oxide.

The HEMT device 100 may include a metal strap 166 on the heat spreading structure 140. The metal strap 166 may be a thermally conductive metal material. For instance, the metal strap 166 may include copper, cobalt, gold, and/or a composite metal. The heat spreading structure 140 may provide a thermally conductive cooling path from the semiconductor structure 102 of the HEMT device 100 to the metal strap 166.

Figure 9:
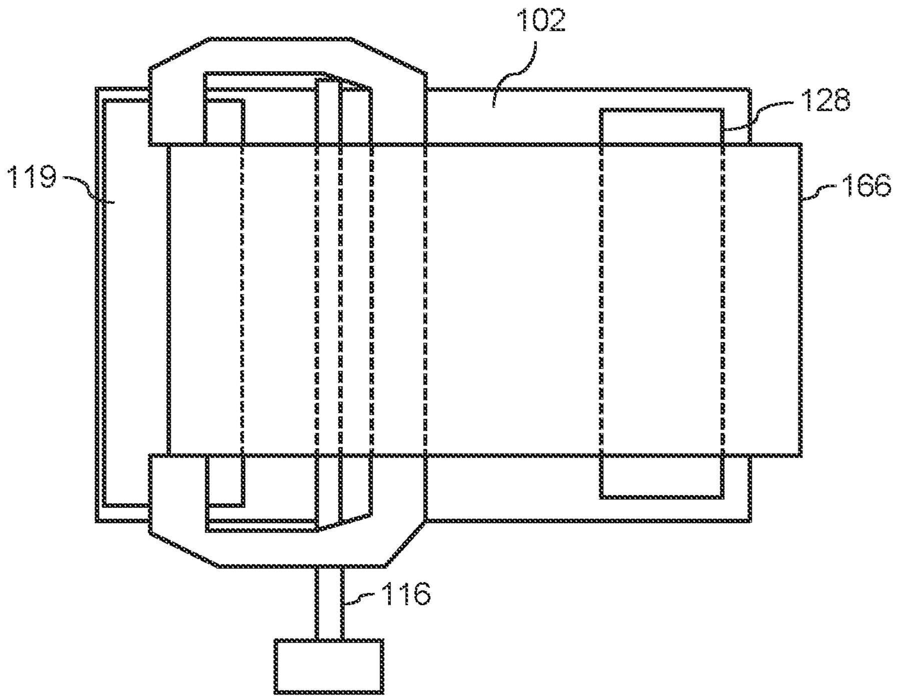
FIG. 9 depicts a plan view of a portion of an example semiconductor device according to example embodiments of the present disclosure.

FIG. 9 depicts a plan view of an example HEMT device 100 that includes a metal strap 166 as discussed with reference to FIG. 8. The HEMT device 100 includes source metallization contact 119 and drain metallization contact 128. A gate contact 116 may be located between the source metallization contact 119 and the drain metallization contact 128. The source metallization contact 119, the drain metallization contact 128 and the gate contact 116 may be on a Group III-nitride semiconductor structure 102.

The HEMT device 100 may include a field plate 126. The field plate 126 may be located between the gate contact 116 and the drain metallization contact 128. The field plate 126 may be connected to the source metallization contact 119 by at least one connection outside the active area of the device such that the connection does not cross over the gate contact 116. However, other suitable connections between the field plate 126 and the source metallization contact 119 or other structures may be provided without deviating from the scope of the present disclosure.

As shown, the semiconductor device includes a metal strap 166 overlapping at least a portion of the active region of the HEMT device 100, including the gate contact 116 and the field plate 126. The heat spreading structure 140 may be between the metal strap 166 and the gate contact 116 and the field plate 126. The metal strap 166 may provide for topside cooling of the semiconductor structure 102 of the HEMT device 100.

Figure 10:
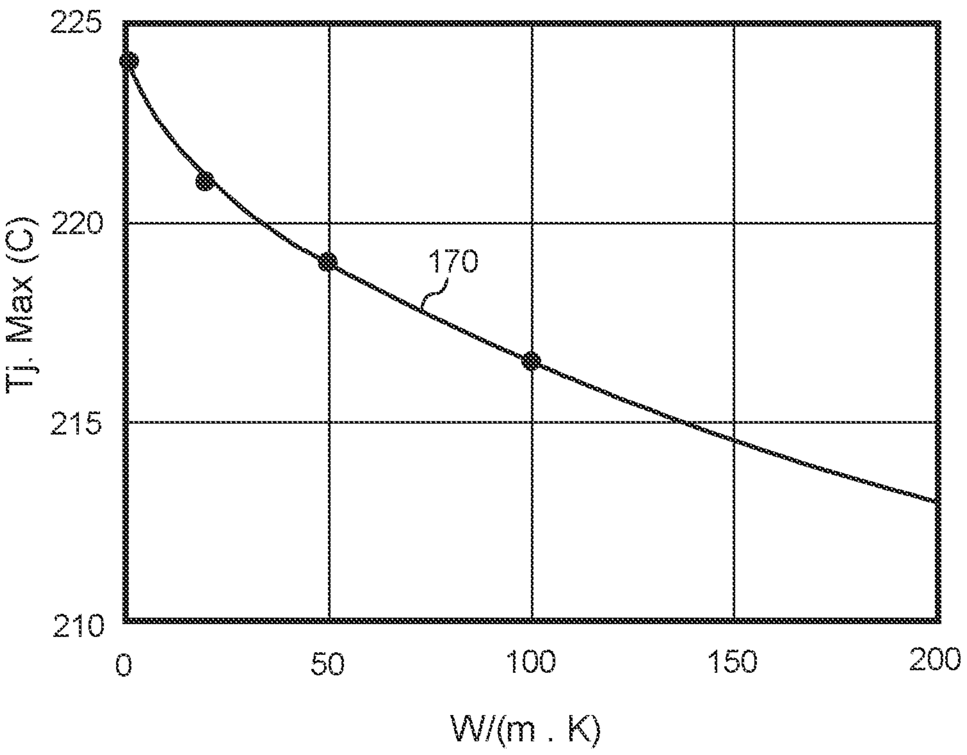
FIG. 10 depicts example simulation results of junction temperature of a semiconductor device as a function of thermal conductivity of one or more thermally conductive layers according to example embodiments of the present disclosure.

FIG. 10 depicts example simulation results of junction temperature of a semiconductor device as a function of thermal conductivity of one or more thermally conductive layers according to example embodiments of the present disclosure. FIG. 10 plots junction temperature of an HEMT device along the vertical axis and thermal conductivity of thermally conductive layers on the HEMT device along the horizontal axis. As demonstrated by curve 170, including a heat spreading structure and/or a thermally conductive passivation layer with high thermal conductivity (e.g., 80 W/(m·k) or greater) on the HEMT device leads to a reduction in junction temperature of the HEMT device.

Figure 11:
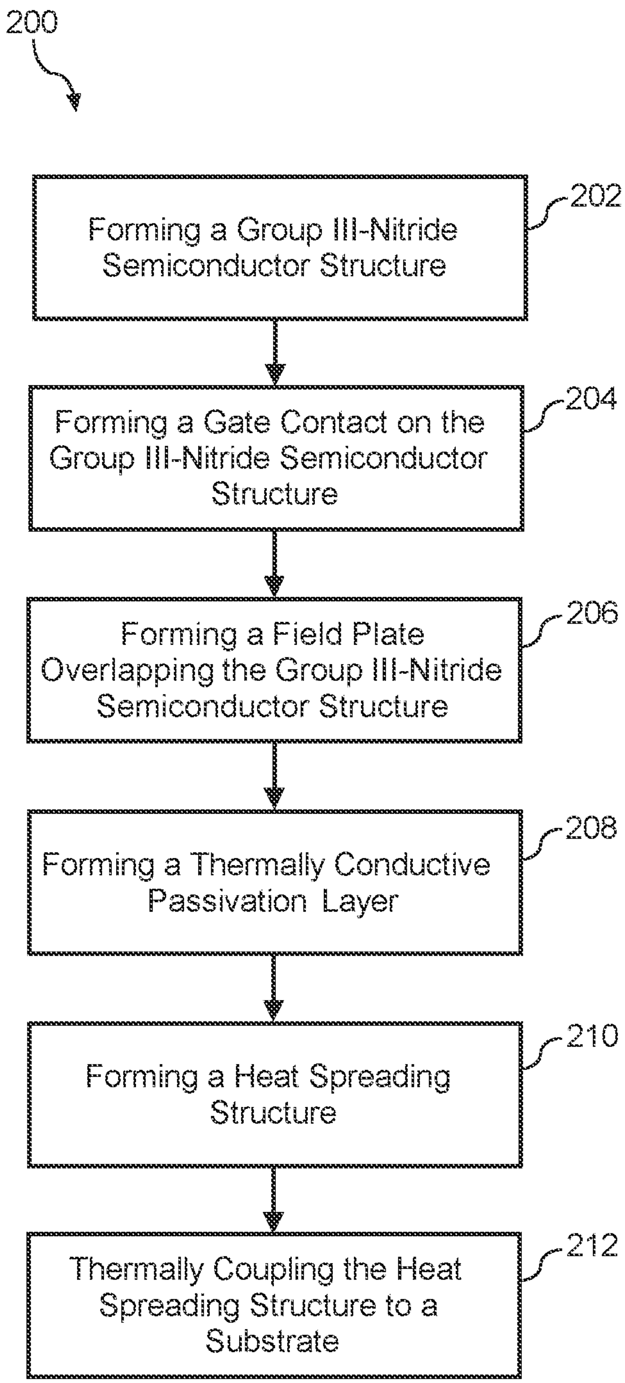
FIG. 11 depicts a flow chart diagram of an example method according to example embodiments of the present disclosure.

FIG. 11 depicts a flow diagram of an example method 200 according to example embodiments of the present disclosure. FIG. 11 depicts steps performed in a particular order for purposes of illustration and discussion. Those of ordinary skill in the art, using the disclosures provided herein, will understand that the various operations, steps, or any of the methods provided herein may be adapted, modified, expanded, include steps not illustrated, omitted, and/or rearranged without deviating from the scope of the present disclosure.

At 202, the method 200 may include forming a Group III-nitride semiconductor structure, for instance, on a substrate. For instance, the method 200 may include forming a Group III-nitride semiconductor structure 102 on a substrate 104, such as a silicon carbide substrate 104, as discussed with reference to FIGS. 1-9. The semiconductor structure 102 may be a multilayer structure and may include one or more of a barrier layer 108, a channel layer 106, and other layers. The Group III-nitride semiconductor structure may be formed, for instance, using metal-organic chemical vapor deposition (MOCVD), molecular beam epitaxy (MBE), or hydride vapor phase epitaxy (HVPE).

At 204, the method 200 may include forming a gate contact on the Group III-nitride semiconductor structure. For instance, the method 200 may include forming the gate contact 116 on the semiconductor structure 102 as discussed with reference to FIG. 1-9. The gate contact may be formed using a suitable metal deposition process, such as a chemical vapor deposition (CVD) process, a physical vapor deposition (PVD) process, a sputtering process, an atomic layer deposition (ALD) process, or other suitable deposition process.

At 206, the method 200 may include forming a field plate overlapping the Group III-nitride semiconductor structure. For instance, the method 200 may include forming the field plate 126 on the semiconductor structure 102 as discussed with reference to FIG. 1-9. In some examples, the field plate may be coupled to a source contact. The field plate may be formed using a suitable metal deposition process, such as a chemical vapor deposition (CVD) process, a physical vapor deposition (PVD) process, a sputtering process, an atomic layer deposition (ALD) process, or other suitable deposition process.

At 208, the method 200 may include forming a thermally conductive passivation layer. For instance, the method 200 may include forming the thermally conductive passivation layer 132 discussed with reference to FIGS. 1-9. In some examples, the thermally conductive passivation layer may be formed such that the thermally conductive passivation layer overlaps the gate contact and is between the field plate and the Group III-nitride semiconductor structure. The thermally conductive passivation layer may directly contact the Group III-nitride semiconductor structure. The thermally conductive passivation layer may be formed using a suitable deposition process, such as chemical vapor deposition (CVD) process, a physical vapor deposition (PVD) process, a sputtering process, an atomic layer deposition (ALD) process, evaporation, plasma-enhanced atomic layer deposition (PEALD), or other suitable deposition process.

The thermally conductive passivation layer may be a material with a high conductivity, such as about 80 W/(m·k) or greater, such as about 100 W/(m·k) or greater. The thermally conductive passivation layer may be a non-metal. The thermally conductive passivation layer may be, for instance, a dielectric material. In some examples, the thermally conductive passivation layer has a dielectric constant of about 3.9 or greater, such as in a range of about 3.9 to about 30. In some examples, the thermally conductive passivation layer has a breakdown field strength of about 3 MV/cm or greater. In some examples, the thermally conductive passivation layer may have a thickness of about 50 nm to about 300 nm, such as about 50 nm to about 100 nm. In some examples, the thermally conductive passivation layer may be aluminum nitride. In some examples, the thermally conductive passivation layer may be silicon carbide, diamond, boron nitride, or beryllium oxide.

Figure 12:
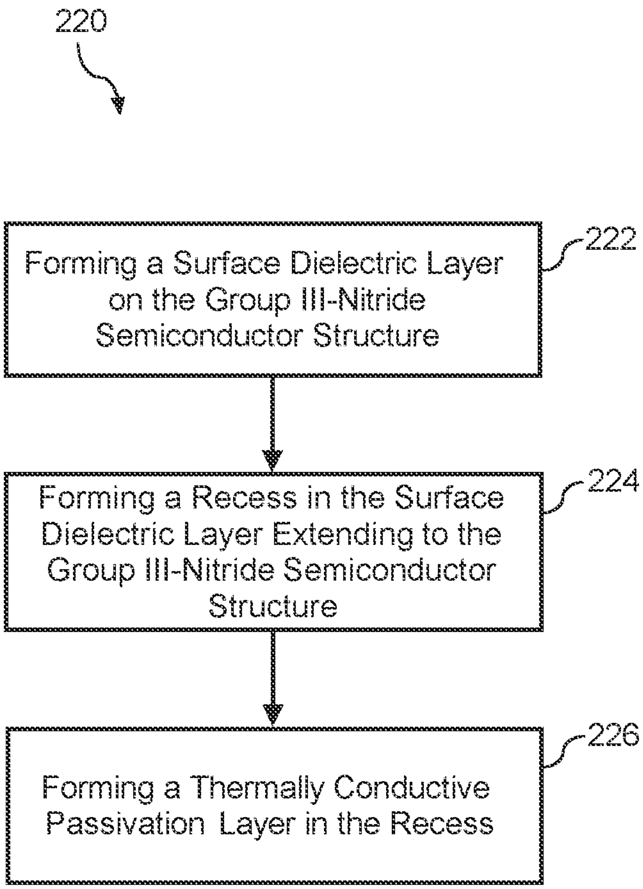
FIG. 12 depicts a flow chart diagram of an example method according to example embodiments of the present disclosure.

FIG. 12 depicts an example method 220 of forming a thermally conductive passivation layer according to example embodiments of the present disclosure. FIG. 12 depicts steps performed in a particular order for purposes of illustration and discussion. Those of ordinary skill in the art, using the disclosures provided herein, will understand that the various operations, steps, of any of the methods provided herein may be adapted, modified, expanded, include steps not illustrated, omitted, and/or rearranged without deviating from the scope of the present disclosure.

At 222, the method 220 may include forming a surface dielectric layer on the Group III-nitride semiconductor structure. For instance, the method may include forming the surface dielectric layer 130 discussed with reference to FIGS. 1-9. The surface dielectric layer may have a thickness of about 145 nm or less, such as in a range of about 80 nm to about 145 nm, such as about 120 nm. The surface dielectric layer may be a silicon nitride layer. Other suitable dielectric materials may be used without deviating from the scope of the present disclosure. For instance, the surface dielectric layer may be $SiO_2$, MgOx, MgNx, ZnO, SiNx, SiOx, alloys or layer sequences thereof, or epitaxial materials. The surface dielectric layer may be formed, for instance, using a suitable deposition process, such as a chemical vapor deposition (CVD) process, a physical vapor deposition (PVD) process, a sputtering process, an atomic layer deposition (ALD) process, or other suitable deposition process.

At 224, the method may include forming a recess in the surface dielectric layer to expose a portion of the Group III-nitride semiconductor structure. For instance, the method may include forming recess 134 (FIGS. 1-3) and/or recess 138 (FIG. 3). In some examples, the recess may be on a drain side of a gate contact or on a source side of a gate contact. In some examples, the recess may be between the field plate and the Group III-nitride semiconductor structure. A portion of a field plate may extend towards and/or at least partially into the recess. The recess may extend all the way through the surface dielectric layer to the Group III-nitride semiconductor structure. In some examples, the recess may be formed using an etch process, such as a wet etch process, plasma-based etch process, or atomic layer etch (ALE) process.

At 226, the method may include forming the thermally conductive passivation layer such that the thermally conductive passivation layer at least partially fills the recess. For instance, the thermally conductive passivation layer 132 may at least partially fill the recess 134 and/or the recess 138 as discussed with reference to FIGS. 1-3. In this way, the thermally conductive passivation layer may directly contact the Group III-nitride semiconductor structure.

Referring back to FIG. 11 at 210, the method 200 may include forming a heat spreading structure. For instance, the method may include forming the heat spreading layer 140 discussed with reference to FIGS. 4-9. The heat spreading structure may overlap the gate contact and the field plate. The heat spreading structure may be formed using a suitable deposition process, such as chemical vapor deposition (CVD) process, a physical vapor deposition (PVD) process, a sputtering process, an atomic layer deposition (ALD) process, evaporation, plasma-enhanced atomic layer deposition (PEALD), or other suitable deposition process.

The heat spreading structure may include one or more heat spreading layers. Each of the heat spreading layers of the heat spreading structure may be a layer of high thermal conductivity. In some examples, the one or more layers of the heat spreading structure may include a material with a high conductivity, such as about 80 W/(m·k) or greater, such as about 100 W/(m·k) or greater. The one or more layers of the heat spreading structure may be a non-metal. The one or more layers of the heat spreading structure may be, for instance, a dielectric material. In some examples, the one or more layers of the heat spreading structure may have a dielectric constant of about 3.9 or greater, such as in a range of about 3.9 to about 30. In some examples, the one or more layers of the heat spreading structure have a breakdown field strength of about 3 MV/cm or greater. In some examples, the heat spreading structure may have a thickness of about 1 micron to about 100 microns, such as about 1 micron to about 10 microns, such as about 2 microns to about 4 microns. In some examples, the one or more layers of the heat spreading structure may be diamond. In some examples, the one or more layers of the heat spreading structure may be silicon carbide, aluminum nitride, boron nitride, or beryllium oxide.

At 212, the method 200 may include thermally coupling the heat spreading layer to a substrate, such as a silicon carbide substrate. For instance, the heat spreading structure 140 may be thermally coupled to a substrate 104 (e.g., a silicon carbide substrate) using one or more thermally conductive vias 144 as discussed with references to FIGS. 4-7.

Example aspects of the present disclosure are set forth below. Any of the below features or examples may be used in combination with any of the embodiments or features provided in the present disclosure.

One example aspect of the present disclosure is directed to a semiconductor device. The semiconductor device includes a Group III-nitride semiconductor structure. The semiconductor device may include a gate contact on the Group III-nitride semiconductor structure. The semiconductor device may include a field plate overlapping the Group III-nitride semiconductor structure. The semiconductor device may include a thermally conductive passivation layer overlapping the gate contact. The thermally conductive passivation layer may be between the field plate and the Group III-nitride semiconductor structure. The thermally conductive passivation layer may contact the Group III-nitride semiconductor structure. The thermally conductive passivation layer may have a thermal conductivity of at least about 80 W/(m·k).

In some examples, the semiconductor device includes a surface dielectric layer on the Group III-nitride semiconductor structure. The surface dielectric layer includes a recess extending to the Group III-nitride semiconductor structure. The thermally conductive passivation layer is in the recess such that the thermally conductive passivation layer contacts the Group III-nitride semiconductor structure.

In some examples, the recess is on a source side of the gate contact. In some examples, the recess is on a drain side of the gate contact. In some examples, the recess is between the field plate and the Group III-nitride semiconductor structure.

In some examples, the gate contact includes one or more overhang portions overlapping the Group III-nitride semiconductor structure. At least a portion of the surface dielectric layer is between the overhang portion and the Group III-nitride semiconductor structure.

In some examples, the thermally conductive passivation layer has a dielectric constant of about 3.9 or greater, such as in a range of about 3.9 to about 30. In some examples, the thermally conductive passivation layer has a breakdown field strength of about 3 MV/cm or greater. In some examples, the thermally conductive passivation layer includes one or more of diamond, silicon carbide, aluminum nitride, boron nitride, or beryllium oxide. In some examples, the thermally conductive passivation layer has a thickness in a range of about 50 nm to about 300 nm.

In some examples, the semiconductor device includes a heat spreading structure overlapping the gate contact and the field plate. The heat spreading structure includes one or more heat spreading layers. In some examples, at least one of the one or more heat spreading layers has a thermal conductivity of at least about 80 W/(m·k). In some examples, at least one of the one or more heat spreading layers has a dielectric constant of about 3.9 or greater, such as in a range of about 3.9 to about 30. In some examples, at least one of the one or more heat spreading layers has a breakdown field strength of about 3 MV/cm or greater. In some examples, at least one of the one or more heat spreading layers includes one or more of diamond, silicon carbide, aluminum nitride, boron nitride, or beryllium oxide. In some examples, the heat spreading structure has a thickness in a range of about 1 micron to about 100 microns, such as in a range of about 2 microns to about 4 microns.

In some examples, the Group III-nitride semiconductor structure is on a substrate (e.g., a silicon carbide substrate). The heat spreading structure is thermally coupled to the substrate through one or more thermally conductive vias.

In some examples, the heat spreading structure includes a first portion and a second portion. A thermal conductivity of the first portion is different from a thermal conductivity of the second portion. In some examples, the second portion is overlapping an active region of the semiconductor device. The active region includes one or more unit semiconductor device cells.

In some examples, the heat spreading structure is a different material relative to the thermally conductive passivation layer.

In some examples, the substrate comprises silicon carbide. In some examples, the semiconductor device comprises a high electron mobility transistor device.

Another example aspect of the present disclosure is directed to a semiconductor device. The semiconductor device includes a Group III-nitride semiconductor structure. The semiconductor device includes a gate contact on the Group III-nitride semiconductor structure. The semiconductor device includes a field plate overlapping the Group III-nitride semiconductor structure. The semiconductor device includes a heat spreading structure overlapping both the gate contact and the field plate. The heat spreading structure has a thermal conductivity of at least about 80 W/(m·k).

In some examples, at least one of the one or more heat spreading layers has a dielectric constant of about 3.9 or greater, such as in a range of about 3.9 to about 30. In some examples, at least one of the one or more heat spreading layers has a breakdown field strength of about 3 MV/cm or greater. In some examples, at least one of the one or more heat spreading layers includes one or more of diamond, silicon carbide, aluminum nitride, boron nitride, or beryllium oxide. In some examples, the heat spreading structure has a thickness in a range of about 1 micron to about 100 microns, such as in a range of about 2 microns to about 4 microns.

In some examples, the Group III-nitride semiconductor structure is on a substrate. The heat spreading structure is thermally coupled to the substrate through one or more thermally conductive vias.

In some examples, the Group III-nitride semiconductor structure comprises a barrier layer and a channel layer. In some examples, the channel layer includes $Al_xGa_{1-x}N$ and the barrier layer includes $Al_yGa_{1-y}N$, where x is in a range between 0 and 0.1 and y is in a range of about 0.15 to about 0.40.

In some examples, the semiconductor device comprises a silicon carbide substrate. In some examples, the semiconductor device is a high electron mobility transistor device.

Another example aspect of the present disclosure is directed to a semiconductor die. The semiconductor die includes a substrate. The semiconductor die includes a Group III-nitride semiconductor structure having an active region. The active region is associated with one or more unit device cells. Each unit device cell includes a transistor device. The semiconductor die includes a heat spreading structure on the Group III-nitride semiconductor structure. The heat spreading structure includes one or more of diamond, silicon carbide, aluminum nitride, boron nitride, or beryllium oxide. The semiconductor die includes one or more vias thermally coupling the heat spreading structure to the substrate.

In some examples, the heat spreading structure has a dielectric constant of about 3.9 or greater, such as in a range of about 3.9 to about 30. In some examples, the heat spreading structure has a breakdown field strength of about 3 MV/cm or greater. In some examples, the heat spreading structure has a thermal conductivity of about 80 W/(m·k) or greater. In some examples, the heat spreading structure has a thickness in a range of about 1 micron to about 100 microns, such as in a range of about 2 microns to about 4 microns.

In some examples, the heat spreading structure includes a first portion and a second portion. A thermal conductivity of the first portion is different from a thermal conductivity of the second portion. In some examples, the second portion is overlapping an active region. The active region including one or more unit transistor device cells.

In some examples, the substrate includes a silicon carbide substrate. In some examples, the one or more unit device cells each include a high electron mobility transistor.

Another example aspect of the present disclosure is directed to a method. The method includes forming a Group III-nitride semiconductor structure. The method includes forming a gate contact on the Group III-nitride semiconductor structure. The method includes forming a field plate overlapping the Group III-nitride semiconductor structure. The method includes forming a thermally conductive passivation layer overlapping the gate contact. The thermally conductive passivation layer is between the field plate and the Group III-nitride semiconductor structure. The thermally conductive passivation layer directly contacts the Group III-nitride semiconductor structure. The thermally conductive passivation layer has a thermal conductivity of at least about 80 W/(m·k).

In some examples, the method includes: forming a surface dielectric layer on the Group III-nitride semiconductor structure; and forming a recess in the surface dielectric layer extending to the Group III-nitride semiconductor structure. Forming the thermally conductive passivation layer includes forming the thermally conductive passivation layer in the recess such that the thermally conductive passivation layer contacts the Group III-nitride semiconductor structure.

In some examples, the recess is on a source side of the gate contact. In some examples, the recess is on a drain side of the gate contact. In some examples, the recess is between the field plate and the Group III-nitride semiconductor structure.

In some examples, the gate contact includes one or more overhang portions overlapping the Group III-nitride semiconductor structure. Forming the surface dielectric layer includes forming at least a portion of the surface dielectric layer between the overhang portion and the Group III-nitride semiconductor structure.

In some examples, the thermally conductive passivation layer has a dielectric constant of about 3.9 or greater, such as in a range of about 3.9 to about 30. In some examples, the thermally conductive passivation layer has a breakdown field strength of about 3 MV/cm or greater. In some examples, the thermally conductive passivation layer includes one or more of diamond, silicon carbide, aluminum nitride, boron nitride, or beryllium oxide. In some examples, the thermally conductive passivation layer has a thickness in a range of about 50 nm to about 300 nm.

In some examples, the method includes forming a heat spreading structure overlapping the gate contact and the field plate. The heat spreading structure includes one or more heat spreading layers. At least one of the one or more heat spreading layers has a thermal conductivity of at least about 80 W/(m·k).

In some examples, at least one of the one or more heat spreading layers comprises one or more of diamond, silicon carbide, aluminum nitride, boron nitride, or beryllium oxide. In some examples, the heat spreading structure has a thickness in a range of about 1 micron to about 100 microns.

In some examples, the heat spreading structure is thermally coupled to a substrate through one or more thermally conductive vias. In some examples, the substrate includes silicon carbide.

Another example aspect of the present disclosure is directed to a method. The method includes forming a Group III-nitride semiconductor structure. The method includes forming a gate contact on the Group III-nitride semiconductor structure. The method includes forming a field plate overlapping the Group III-nitride semiconductor structure. The method includes forming a heat spreading structure overlapping both the gate contact and the field plate. The heat spreading structure has a thermal conductivity of at least about 80 W/(m·k).

In some examples, the heat spreading structure comprises one or more heat spreading layers. In some examples, at least one of the one or more heat spreading layers has a dielectric constant of about 3.9 or greater, such as in a range of about 3.9 to about 30. In some examples, at least one of the one or more heat spreading layers has a breakdown field strength of about 3 MV/cm or greater. In some examples, at least one of the one or more heat spreading layers includes one or more of diamond, silicon carbide, aluminum nitride, boron nitride, or beryllium oxide. In some examples, the heat spreading structure has a thickness in a range of about 1 micron to about 100 microns, such as in a range of about 2 microns to about 4 microns.

In some examples, the method may include thermally coupling the heat spreading structure to a substrate using one or more thermally conductive vias. In some examples, the substrate includes silicon carbide.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A semiconductor device, comprising:

a Group III-nitride semiconductor structure;

a gate contact on the Group III-nitride semiconductor structure, a field plate overlapping the Group III-nitride semiconductor structure;

a surface dielectric layer on the Group III-nitride semiconductor structure, the surface dielectric layer comprising a recess extending into the Group III-nitride semiconductor structure; and a thermally conductive passivation layer overlapping the gate contact, the thermally conductive passivation layer between the field plate and the Group III-nitride semiconductor structure, the thermally conductive passivation layer directly contacting the Group III-nitride semiconductor structure, the thermally conductive passivation layer being in the recess such that the thermally conductive passivation layer contacts the Group III-nitride semiconductor structure; and wherein the thermally conductive passivation layer has a thermal conductivity of at least 80 W/(m·k).

2. The semiconductor device of claim 1, wherein the recess is on a source side of the gate contact or on a drain side of the gate contact.

3. The semiconductor device of claim 1, wherein the recess is between the field plate and the Group III-nitride semiconductor structure.

4. The semiconductor device of claim 1, wherein the thermally conductive passivation layer has a dielectric constant in a range of 3.9 to 30.

5. The semiconductor device of claim 1, wherein the thermally conductive passivation layer has a breakdown field strength of 3 MV/cm or greater.

6. The semiconductor device of claim 1, wherein the thermally conductive passivation layer comprises one or more of diamond, silicon carbide, aluminum nitride, boron nitride, or beryllium oxide.

7. The semiconductor device of claim 1, wherein the thermally conductive passivation layer has a thickness in a range of 50 nm to 300 nm.

8. The semiconductor device of claim 1, further comprising a heat spreading structure overlapping the gate contact and the field plate, the heat spreading structure comprising one or more heat spreading layers.

9. The semiconductor device of claim 8, wherein at least one of the one or more heat spreading layers has a thermal conductivity of at least about 80 W/(m·k).

10. The semiconductor device of claim 8, wherein at least one of the one or more heat spreading layers has a dielectric constant in a range of 3.9 to 30.

11. The semiconductor device of claim 8, wherein at least one of the one or more heat spreading layers comprises one or more of diamond, silicon carbide, aluminum nitride, boron nitride, or beryllium oxide.

12. The semiconductor device of claim 8, wherein the heat spreading structure has a thickness in a range of 1 micron to 100 microns.

13. The semiconductor device of claim 8, wherein the Group III-nitride semiconductor structure is on a substrate, wherein the heat spreading structure is thermally coupled to the substrate through one or more thermally conductive vias.

14. The semiconductor device of claim 8, wherein the heat spreading structure comprises a first portion and a second portion, wherein a thermal conductivity of the first portion is different from a thermal conductivity of the second portion; wherein the second portion is overlapping an active region of the semiconductor device, the active region comprising one or more unit semiconductor device cells.

15. The semiconductor device of claim 8, wherein the heat spreading structure is a different material relative to the thermally conductive passivation layer.

16. The semiconductor device of claim 13, wherein the substrate comprises silicon carbide.

17. The semiconductor device of claim 1, wherein the semiconductor device comprises a high electron mobility transistor device.

18. A semiconductor die, comprising:

a substrate;

a Group III-nitride semiconductor structure comprising an active region, the active region associated with one or more unit device cells, each unit device cell comprising a transistor device;

a heat spreading structure on the Group III-nitride semiconductor structure, the heat spreading structure comprising a first portion and a second portion, wherein a thermal conductivity of the first portion is different from a thermal conductivity of the second portion, wherein the second portion is overlapping the active region, wherein the heat spreading structure further comprises one or more of diamond, silicon carbide, aluminum nitride, boron nitride, or beryllium oxide; and one or more vias thermally coupling the heat spreading structure to the substrate.

19. A method, comprising:

forming a Group III-nitride semiconductor structure;

forming a gate contact on the Group III-nitride semiconductor structure, forming a field plate overlapping the Group III-nitride semiconductor structure;

forming a surface dielectric layer on the Group III-nitride semiconductor structure;

forming a recess in the surface dielectric layer extending into the Group III-nitride semiconductor structure; and forming a thermally conductive passivation layer overlapping the gate contact, the thermally conductive passivation layer between the field plate and the Group III-nitride semiconductor structure, the thermally conductive passivation layer directly contacting the Group III-nitride semiconductor structure;

wherein forming the thermally conductive passivation layer comprises forming the thermally conductive passivation layer in the recess such that the thermally conductive passivation layer contacts the Group III-nitride semiconductor structure; and wherein the thermally conductive passivation layer has a thermal conductivity of at least 80 W/(m·k).

20. A semiconductor die, comprising:

a substrate;

a Group III-nitride semiconductor structure on the substrate and comprising an active region, the active region associated with one or more unit device cells, each unit device cell comprising a transistor device; and a heat spreading structure on the Group III-nitride semiconductor structure, the heat spreading structure comprising a first portion and a second portion, wherein a thermal conductivity of the first portion is different from a thermal conductivity of the second portion, wherein the second portion is overlapping the active region, wherein the heat spreading structure further comprises silicon carbide.

* * * * *